(12) United States Patent
Chuang et al.

(10) Patent No.: US 8,724,329 B2
(45) Date of Patent: May 13, 2014

(54) CASING STRUCTURE AND SERVER USING THE SAME

(75) Inventors: Chih-Wei Chuang, Taipei (TW); Kuei-Hua Chen, Taipei (TW)

(73) Assignee: Inventec Corporation, Taipei (TW)

( * ) Notice: Subject to any disclaimer, the term of this patent is extended or adjusted under 35 U.S.C. 154(b) by 294 days.

(21) Appl. No.: 13/418,708

(22) Filed: Mar. 13, 2012

(65) Prior Publication Data

US 2013/0163169 A1    Jun. 27, 2013

(30) Foreign Application Priority Data

Dec. 23, 2011   (TW) .............................. 100148312 A

(51) Int. Cl.
*H05K 5/00* (2006.01)
(52) U.S. Cl.
USPC ........................................ 361/724; 312/223.2
(58) Field of Classification Search
USPC ............................ 361/679.4, 724; 312/223.2
See application file for complete search history.

(56) References Cited

U.S. PATENT DOCUMENTS

| | | | | |
|---|---|---|---|---|
| 5,235,493 A * | 8/1993 | Yu | ............................ | 361/679.31 |
| 5,269,598 A * | 12/1993 | Liu | ............................ | 312/223.2 |
| 5,473,507 A * | 12/1995 | Schwegler et al. | ........ | 361/679.4 |
| 6,731,508 B2 * | 5/2004 | Chen | .............................. | 361/724 |
| 6,999,319 B2 * | 2/2006 | Wu et al. | ........................ | 361/724 |
| 7,609,525 B2 * | 10/2009 | Fan et al. | ..................... | 312/223.2 |
| 8,081,490 B2 * | 12/2011 | Chen et al. | .................. | 312/223.2 |
| 8,405,972 B2 * | 3/2013 | Zhang et al. | ................ | 361/679.4 |
| 2007/0025067 A1 * | 2/2007 | Chen | .............................. | 361/679 |
| 2008/0101011 A1 * | 5/2008 | Carr et al. | ...................... | 361/686 |
| 2008/0144272 A1 * | 6/2008 | Liang | .......................... | 312/223.2 |
| 2008/0304228 A1 * | 12/2008 | Bailey et al. | ................... | 361/686 |
| 2012/0008285 A1 * | 1/2012 | Renkel et al. | .................. | 361/724 |
| 2012/0020006 A1 * | 1/2012 | Xu et al. | ..................... | 361/679.4 |
| 2012/0224313 A1 * | 9/2012 | Hu et al. | ..................... | 361/679.4 |

FOREIGN PATENT DOCUMENTS

TW        M246994        10/2004

* cited by examiner

*Primary Examiner* — Lisa Lea Edmonds
(74) *Attorney, Agent, or Firm* — CKC & Partners Co., Ltd.

(57) ABSTRACT

A server including a housing, a circuit board, a bracket, and multiple members is provided. The housing has a bottom case and a cover assembled to the bottom case in an open or a closed manner. The circuit board is disposed on the bottom case. The bracket is assembled between the bottom case and the cover. The cover and the bracket deform the bottom case in a positive way. The members are disposed on the circuit board. The members deform the circuit board and the bottom case in a negative way with the weight thereof. The positive deformation and the negative deformation of the bottom case are neutralized, such that the bottom case and the circuit board are maintained on a horizontal plane.

14 Claims, 5 Drawing Sheets

CASING STRUCTURE AND SERVER USING THE SAME

CROSS-REFERENCE TO RELATED APPLICATION

This application claims the priority benefit of Taiwan application serial no. 100148312, filed Dec. 23, 2011. The entirety of the above-mentioned patent application is hereby incorporated by reference herein and made a part of this specification.

BACKGROUND OF THE INVENTION

1. Field of the Invention

The present invention relates to a casing structure, in particular, to a casing structure used in a server housing.

2. Description of Related Art

In recent years, computer servers have gradually developed from traditional large-sized upright servers which occupy a large space to rack servers, in which several hosts with the height of 1U (in the server field, U specifically refers to a thickness of a rack server, and 1U=4.445 cm) are disposed in a cabinet for uniform management.

Generally, each server unit in the rack server is disposed in the cabinet in a slidable manner. Based on this concept, the entire device servo system can be regarded as a big cabinet, and multiple horizontally disposed server unit drawers (namely, housings) may be mounted in the cabinet. The server units in these drawers are interconnected, to increase multi-tasking of the server with high computation efficiency.

In addition, considering the manufacturing cost, the cabinet or housing is usually of light weight. However, in order to increase a space utilization rate and the efficacy of the server, various necessary members are arranged in each housing as much as possible. In this way, the weight of these members brings a great load to a mother board and the housing. Generally, the members deform the mother board and the housing along a gravity direction with the weight thereof. In the cabinet of the rack server, with the concern of the space, not much space is reserved between adjacent server units. Therefore, when the members on the mother board needs maintenance or needs repairing due to a failure, a lower housing cannot be opened as being interfered by an upper housing which is deformed along the gravity direction under the weight of the members.

SUMMARY OF THE INVENTION

Accordingly, the present invention is directed to a casing structure which has a capability of resisting deformation.

The present invention provides a server, and a housing thereof has a capability of resisting deformation caused by members therein.

An embodiment of the present invention provides a server, including a housing, a circuit board, a bracket and multiple members. The housing has a bottom case and a cover assembled to the bottom case in an open or a closed manner. The circuit board is disposed on the bottom case. The bracket is assembled between the circuit board and the cover. The cover and the bracket deform the bottom case in a positive way. The members are disposed on the circuit board. The members deform the circuit board and the bottom case in a negative way with the weight thereof. The positive deformation and the negative deformation of the bottom case are neutralized, such that the bottom case and the circuit board are maintained on a horizontal plane.

An embodiment of the present invention provides a casing structure, including a housing, a board element, a rigid bracket and multiple members. The board element is disposed in the housing. The rigid bracket has a contact surface. The rigid bracket is assembled to a plane in the housing through the contact surface. The contact surface is non-planar, so that after the housing and the rigid bracket are integrated, the plane deforms along with the contact surface. The members are disposed on the board element. The members deform the plane with the weight thereof, in which the members and the rigid bracket respectively deform the plane, and the deformations are of opposite directions and same magnitudes.

Based on the above, in the embodiments of the present invention, in the casing structure and the server using the same, the bracket is assembled to the bottom case, so that the bottom case integrated with the bracket is deformed as being affected by the bracket, namely, providing the bottom case with a positive deforming force in advance through the bracket, thereby being capable of bearing the negative deformation of the circuit board caused by the weight of the members at the bottom case. Therefore, the positive deformation and the negative deformation are neutralized, such that the bottom case and the circuit board are maintained on a horizontal plane, thereby achieving a non-deformation state and further enabling the housing of the server to smoothly move into or move out of the rack.

In order to make the aforementioned features and advantages of the present invention comprehensible, embodiments are described in detail below with reference to the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
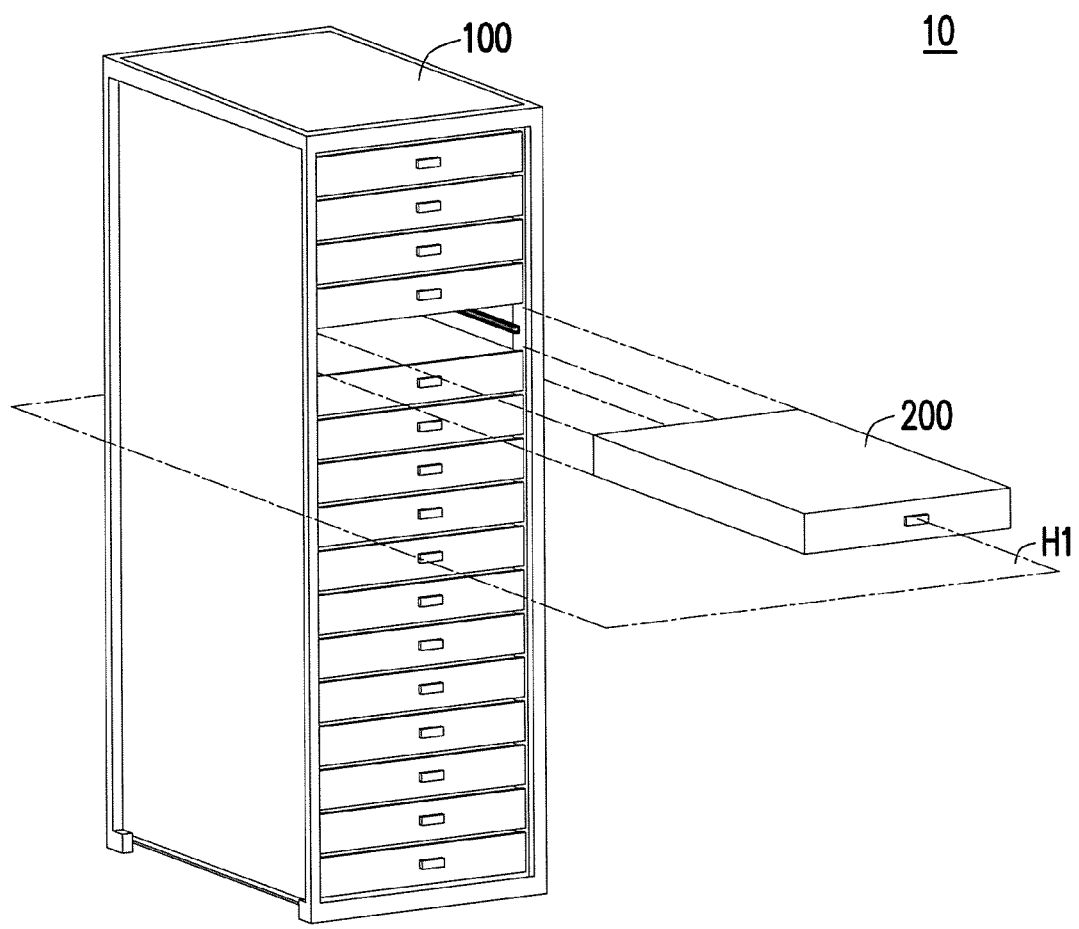
FIG. 1 is a schematic view of a server according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
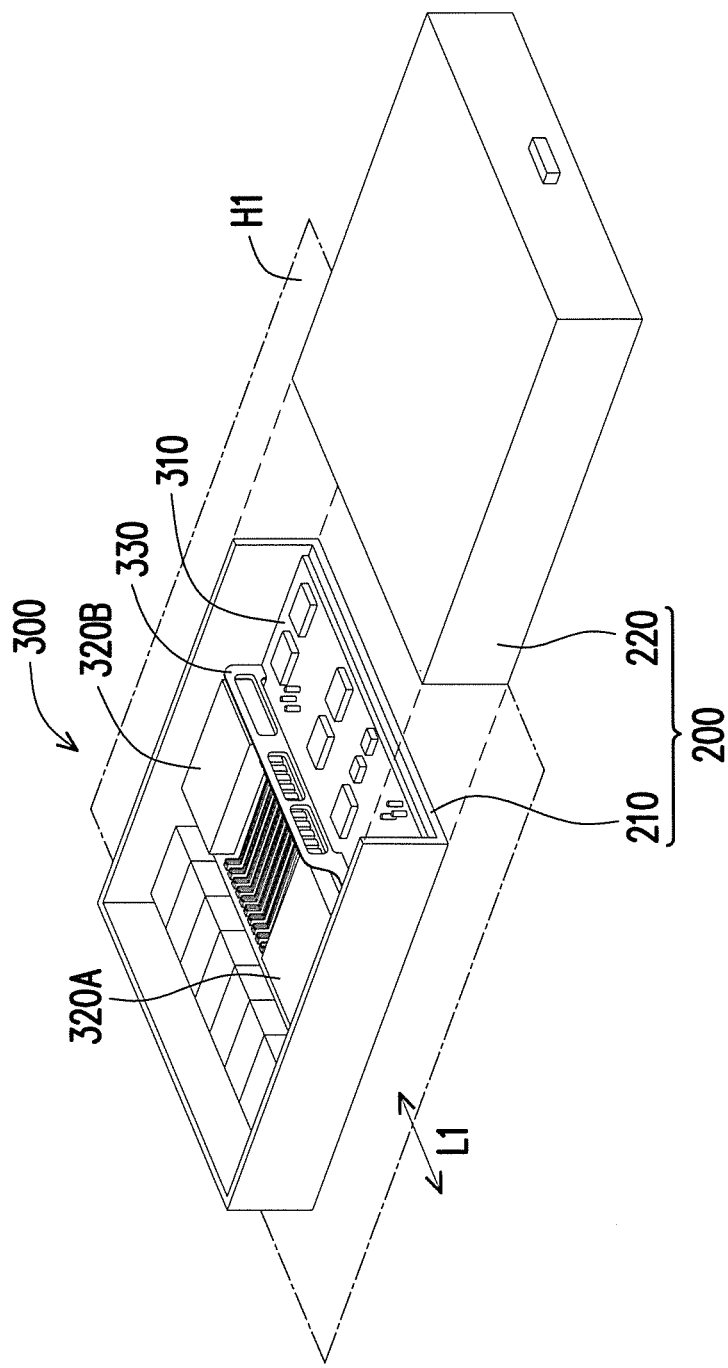
FIG. 2 is an exploded view of a housing in a server of FIG. 1.

FIG. 1 is a schematic view of a server according to an embodiment of the present invention. FIG. 2 is an exploded view of a housing in the server of FIG. 1. Referring to FIG. 1 and FIG. 2 at the same time, in this embodiment, a server 10 includes a rack 100, multiple housings 200 and a circuit board module 300 disposed in each housing 200. Each housing 200 is applicable to moving into or moving out of the rack 100, to facilitate a user to assemble, disassemble or repair the circuit board module 300 therein. For the understanding of the technical feature of the present invention, the single housing 200 and the circuit board module 300 therein are taken as an example for description.

In this embodiment, the housing 200 includes a bottom case 210 and a cover 220, in which the cover 220 is assembled to the bottom case 210 in a slidable manner, so that the cover changes between an open state (as shown in FIG. 2) and a closed state (as shown in FIG. 1) with respect to the bottom case 210. A user can pull the housing 200 out of the rack 100, and then remove the assembling relation between bottom case 210 and the cover 220, so that the cover 220 slides away from the bottom case 210, facilitating assembling, disassembling or maintenance of the circuit board module 300 in the housing 200. The integration relation between the cover 220 and the bottom case 210 is not limited herein.

The circuit board module 300 includes a circuit board 310 and multiple members 320A and 320B disposed on the circuit board 310. The circuit board 310 may be, for example, a mother board used in the server 10. The circuit board 310 is disposed on the bottom case 210 of the housing 200, and is located on a same horizontal plane H1 with the bottom case 210 (that is, the circuit board 310 and the bottom case 210 can be regarded as being located at two opposite sides of the horizontal plane H1). Herein, the horizontal plane H1 is a virtual horizontal reference plane with respect to the state of the server shown in FIG. 1. Each housing 200 moves out of or moves into the rack 100 along a horizontal plane H1.

A plurality of members are disposed on the circuit board 310, and the members such as electronic components encapsulated on the mother board or heat dissipation members assembled thereon. In order to clearly describe the technical features of the present invention, only two members 320A and 320B are taken as objects for illustration. In this embodiment, the members 320A and 320B may be, for example, a heat dissipation fin set assembled on a system chip, and are usually made of metal materials to achieve a desirable heat dissipation effect. As a result, the weight of the members 320A and 320B is relatively great with respect to other electronic components. Therefore, the members 320A and 320B which are used as the heat dissipation fins are a main reason for the deformation of the circuit board 310 and the housing 200. Definitely, the form of the members is not limited in the present invention, any member that deforms the circuit board 310 or the housing 200 with the weight thereof can be adapted in the present embodiment.

Figure 3:
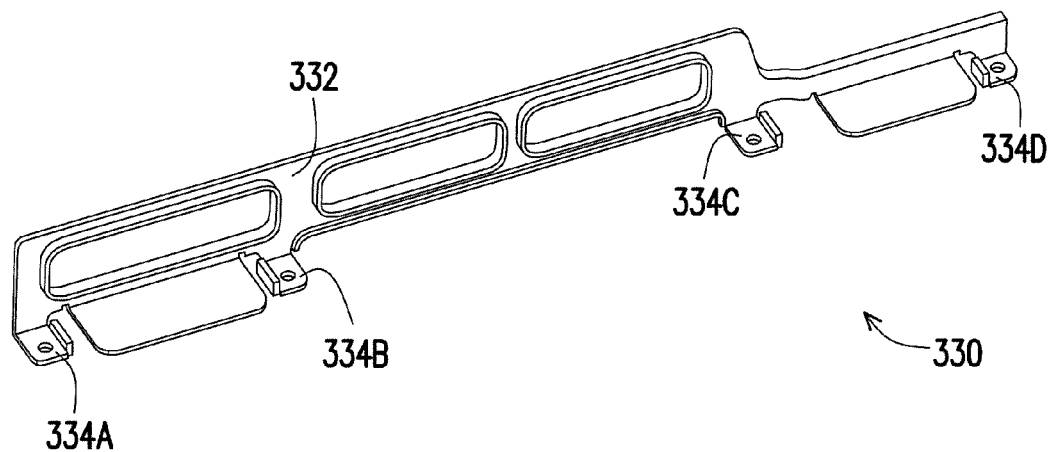
FIG. 3 is a schematic view of a bracket of FIG. 2.
Figure 4:
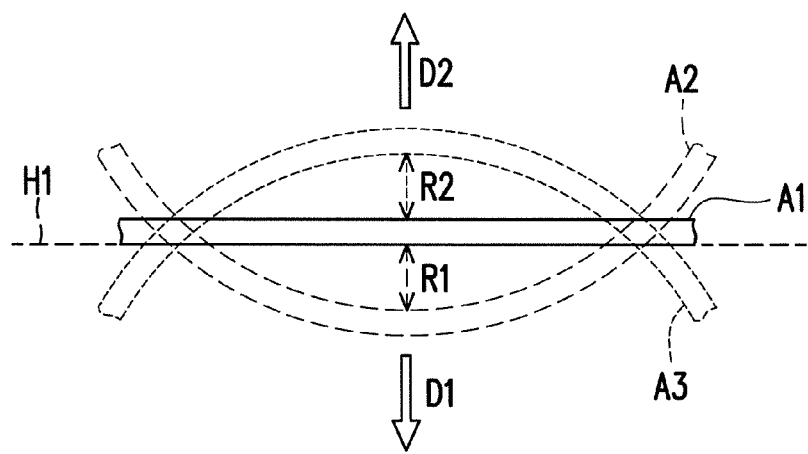
FIG. 4 is a schematic view of stress and deformation of a circuit board and a bottom case of FIG. 2.

In order to solve the deformation of the bottom case 210 of the housing 200 and the circuit board 310 therein due to the weight of the members 320A and 320B, the circuit board module 300 of this embodiment further includes a bracket 330 assembled to the bottom case 210. FIG. 3 is a schematic view of a bracket of FIG. 2. FIG. 4 is a schematic view of stress and deformation of a circuit board and a bottom case of FIG. 2. In FIG. 4, the stress and deformation state of the circuit board 310 and the bottom case 210 when the bracket 330 is disposed on the bottom case 210 and the members 320A and 320B are respectively disposed on the circuit board 310 are drawn with board-shaped outlines A1, A2 and A3 of dashed lines and solid lines. As the circuit board 310 is assembled to the bottom case 210 of the housing 200, the circuit board 310 and the bottom case 210 have the same stress and deformation. The board-shaped outline A1 represents the structure of the circuit board 310 and the bottom case 210 at the same time herein (the same manner is applicable to the outlines A2 and A3).

Referring to FIG. 2 to FIG. 4 at the same time, specifically, the members 320A and 320B deform the circuit board 310 and the bottom case 210 towards a first direction D1 with respect to the horizontal plane H1, namely the board-shaped outline A2 shown in FIG. 4, with the weight thereof. In addition, the bracket 330 is assembled to the bottom case 210, so that the bottom case 210 is deformed towards a second direction D2, in which the first direction D1 and the second direction D2 are opposite and respectively perpendicular to the horizontal plane H1. The bracket 330 deforms the bottom case 210 in advance, so that the outlines of the circuit board 310 and the bottom case 210 are maintained at the same horizontal plane H1 (namely the board-shaped outline A1) under the stress of the opposite directions (D1 and D2).

Figure 5:
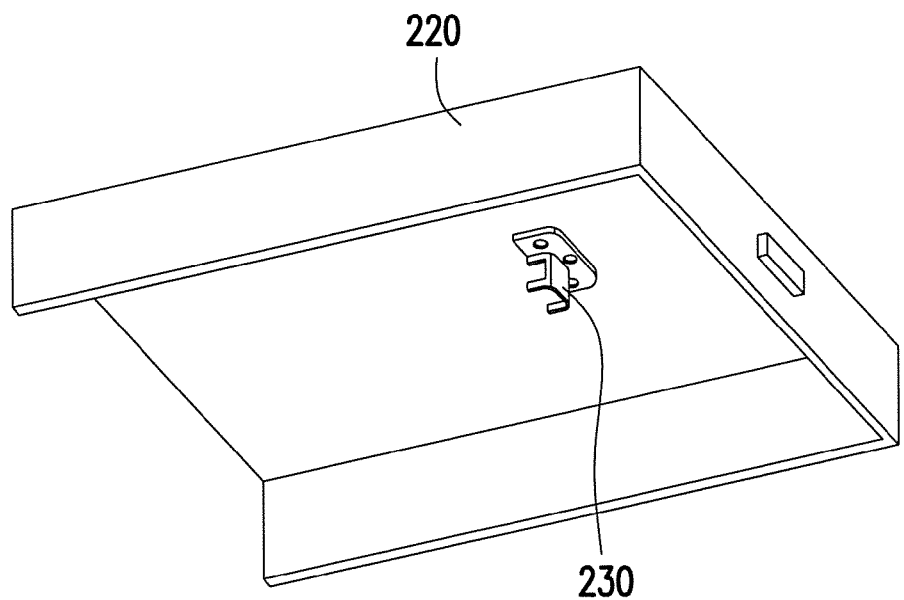
FIG. 5 is a schematic view of a cover of FIG. 2 from another view point.
Figure 6:
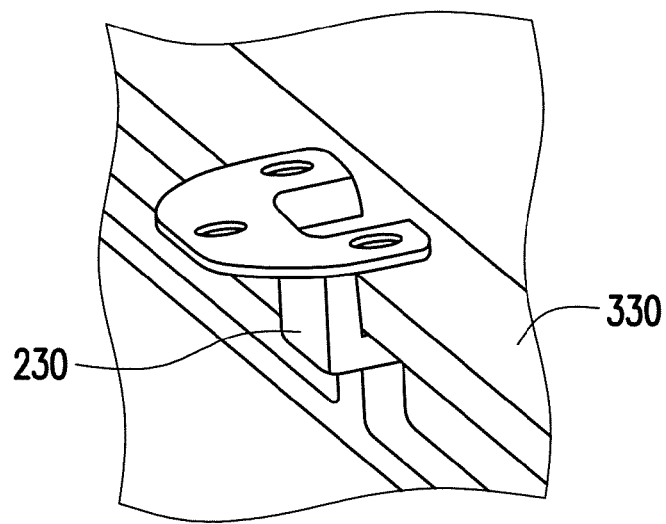
FIG. 6 is a schematic view of a lifting hook of FIG. 5 fastened on a bracket of FIG. 3.

FIG. 5 is a schematic view of a cover of FIG. 2 from another view point. FIG. 6 is a schematic view of a lifting hook of FIG. 5 fastened on a bracket of FIG. 3. Referring to FIG. 2 to FIG. 5 at the same time, in this embodiment, in order to provide the bracket 330 with enough support, the housing 200 further includes a lifting hook 230, which is disposed on a side of the cover 220 facing the bottom case 210. When the cover 220 is in the closed state with respect to the bottom case 210, the lifting hook 230 is fastened on the bracket 330, that is, at this time, the bracket 330 bears a stress of the second direction D2 from the cover 220 through the lifting hook 230. In this manner, the cover 220 and the bracket 330 deform the circuit board 310 and the bottom case 210 in a positive way (namely the board-shaped outline A3 in FIG. 2), and the deformation is R1. On the other hand, the members 320A and 320B deform the circuit board 310 and the bottom case 210 in a negative way (namely the board-shaped outline A2 in FIG. 2), and the deformation is R2. More importantly, the deformations R1 and R2 are of same magnitudes and opposite directions (that is, the deformations R1 and R2 are neutralized), so that the circuit board 310 and the bottom case 210 finally achieve an effect that the board-shaped outline A1 is located on the horizontal plane H1. It should be noted herein that, the positive deformation and the negative deformation in this embodiment are relative description manners with the horizontal plane H1 as a reference, in which the positive deformation is towards the second direction D2 and the negative deformation is towards the first direction D1.

In other words, the positive deformation may be classified into a first positive deformation and a second positive deformation, in which bracket 330 assembled to the bottom case 210 brings the first positive deformation. The lifting hook 230 is fastened on the bracket 330, so that the cover 220 can provide the bottom case 210 with a deformation, which is the second positive deformation. A sum of the first positive deformation and the second positive deformation is neutralized with the negative deformation.

Figure 7:
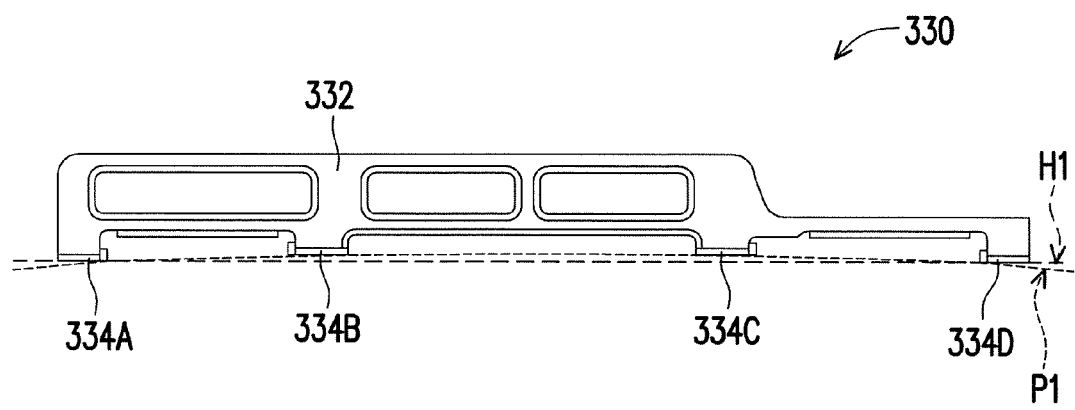
FIG. 7 is a side view of a bracket of FIG. 3.

In another aspect, FIG. 7 is a side view of a bracket of FIG. 3. Referring to FIG. 3, FIG. 6 and FIG. 7 at the same time, in this embodiment, the bracket 330 has a body 332 and multiple locking portions 334A, 334B, 334C and 334D extending from the body 332, in which the body 332 may be, for example a rigid structure formed by a cross beam, a cross bar or a truss. The lifting hook 230 is fastened on the body 332, so that the body 332 bears the support from the cover 220 along the second direction D2.

In addition, in this embodiment, the locking portions 334A, 334B, 334C and 334D are locked on the bottom case 210 through multiple locking elements (not shown), so that the locking portions 334A, 334B, 334C and 334D are located between the circuit board 310 and the bottom case 210, while the body 332 can be disposed on the bottom case 210 in an upright manner, thereby enabling the lifting hook 230 to be fastened on the body 332 between the circuit board 310 and cover 220. It should be noted that, before the body 332 and the bottom case 210 are integrated, distances from the locking portions 334A, 334B, 334C and 334D to the horizontal plane H1 are different from each other, that is, in this embodiment, the locking portions 334A, 334B, 334C and 334D are distributed in an arch-shaped outline with respect to the horizontal plane H1. The distances from the locking portions 334B and 334C which are near a center of the body 332 to the horizontal plane H1 are larger than the distances from the locking portions 334A and 334D which are near two sides of the body 332 to the horizontal plane H1. In this manner, after being fixed on the bottom case 210 through the locking portions 334A, 334B, 334C and 334D, the body 332 can enable the circuit board 310 and the bottom case 210 to be in the state of the board-shaped outline A3 shown in FIG. 4.

That is to say, the locking portions 334A, 334B, 334C and 334D form a contact surface P1 having an arch-shaped outline, so that the horizontal plane H1 where the bottom case 210 and the circuit board 310 are located is deformed along the contact surface P1 after the bracket 330 is assembled thereon, and demonstrates the arch-shaped outline. In this manner, after the members 320A and 320B are disposed on the circuit board 310 and the bottom case 210, the deformation caused by the members 320A and 320B are borne by the preset deformation, and the weight of the members 320A and 320B is dispersed through the arch-shaped outline, so as to prevent the weight of the members 320A and 320B from being centralized at the center of the circuit board 310 and the bottom case 210 (which is the most weak position of the structure of the circuit board 310 and the bottom case 210), thereby improving the structural strength of the circuit board 310 and the bottom case 210.

The number of the locking portions 334A, 334B, 334C and 334D or the distances from the locking portions 334A, 334B, 334C and 334D to the horizontal plane H1 are not limited in this embodiment, which should be matched with the member arrangement in the housing 200. For example, referring to FIG. 2, in this embodiment, the members 320A and 320B are disposed on the circuit board 310 along an axis L1 (drawn in FIG. 2) with respect to the bottom case 210, and therefore the bracket 330 should also be assembled to the bottom case 210 along the axis L1.

In other words, the distribution axial direction of the members 320A and 320B on the circuit board 310 is in consistency with that of the bracket 330 (namely the locking portions 334A, 334B, 334C and 334D thereof) on the bottom case 210. Only on the basis of this disposition principle, the deformation of the circuit board 310 and the bottom case 210 caused by the members 320A and 320B and the deformation of the bottom case 210 caused by the bracket 330 in advance can be neutralized.

Based on the above, when performing arrangement in the housing 200 of the server 10, a designer first assembles the bracket 330 to the circuit board 310 to deform the bottom case 210 in a positive way, and then disposes the members (such as the members 320A and 320B that deform the circuit board 310 and the bottom case 210 in this embodiment) on these positively deformed positions, thereby achieving a result of neutralizing the deformations of the circuit board 310 and the bottom case 210.

In addition, the shape or the number of the bracket 330 is not limited, that is, when multiple members are distributed in multiple axial directions, the designer may dispose a bracket 330 for each axial direction, so that the deformation of the circuit board 310 and the bottom case 210 caused by the bracket 330 is a three-dimensional deformation widely distributed on the horizontal plane H1.

Based on the above, in the embodiments of the present invention, in the casing structure and the server using the same, the bracket is assembled to the bottom case of the housing, so that the bottom case integrated with the bracket is deformed as being affected by the bracket, namely, providing the bottom case with a positive deforming force in advance through the bracket, and further disposing members capable of deforming the circuit board in a negative way at the positively defamed positions of the bottom case. Therefore, the circuit board is maintained on a horizontal plane as the support of the bottom case and the weight of the members are neutralized, thereby achieving a non-deformation state and further enabling the housing of the server to smoothly move into or move out of the rack.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A server, comprising:
a housing, comprising a bottom case and a cover assembled to the bottom case in an open or a closed manner;
a circuit board, disposed on the bottom case;
a bracket, assembled between the bottom case and the cover, wherein the cover and the bracket deform the bottom case in a positive way; and
multiple members, disposed on the circuit board, wherein the members deform the bottom case in a negative manner with the weight thereof, and the positive deformation and the negative deformation of the bottom case are neutralized, so that the bottom case and the circuit board are maintained on a horizontal plane.

2. The server according to claim 1, wherein the housing further comprises a lifting hook, disposed on a side of the cover facing the circuit board, and when the cover is closed on the bottom case, the lifting hook is fastened on the bracket.

3. The server according to claim 2, wherein the bracket comprises a body and multiple locking portions extending from the body, and the locking portions are locked to the bottom case and located between the circuit board and the bottom case, so that the body is disposed on the bottom case in an upright manner and the lifting hook is fastened on the body.

4. The server according to claim 3, wherein the body is a rigid structure.

5. The server according to claim 3, wherein before the body and the bottom case are integrated, distances from the locking portions to the horizontal plane are different from each other.

6. The server according to claim 5, wherein the locking portions are distributed in an arch-shaped outline with respect to the horizontal plane.

7. The server according to claim 5, wherein the positive deformation comprises a first positive deformation and a second positive deformation, the body is fixed on the bottom case through the locking portions and brings the first positive deformation, and the lifting hook is fastened on the body, so that the cover brings the second positive deformation to the bottom case.

8. The server according to claim 3, wherein a distribution axial direction of the locking portions on the bottom case is in consistency with that of the members on the circuit board.

9. A casing structure, comprising:
a housing;
a board element, disposed inside the housing;
a rigid bracket, comprising a contact surface, wherein the rigid bracket is assembled to a plane in the housing through the contact surface, the contact surface is non-planar, so that after the housing is integrated with the rigid bracket, the plane deforms along with the contact surface; and multiple members, disposed on the board element, wherein the members deform the plane with the weight thereof, and the deformations of the plane caused by the members and the rigid bracket are of opposite directions and same magnitudes.

10. The casing structure according to claim 9, wherein the contact surface demonstrates an arch-shaped outline with respect to the plane.

11. The casing structure according to claim 9, wherein the housing comprises a bottom case and a cover, the cover is assembled to the bottom case in an open or a closed manner, and the board element and the rigid bracket are respectively disposed on the bottom case.

12. The casing structure according to claim 11, wherein the rigid bracket comprises a body and multiple locking portions extending from the body, the body is locked to the bottom case through the locking portions, and the locking portions are located between the bottom case and the board element.

13. The casing structure according to claim 12, wherein the locking portions arranged on the body form the contact surface of the rigid bracket, and distances from the locking portions to the plane are different from each other.

14. The casing structure according to claim 12, further comprising:

a lifting hook, disposed on a side of the cover facing the board element, wherein when the cover is closed on the bottom case, the lifting hook is fastened on the body.

* * * * *